United States Patent
Hirler et al.

(10) Patent No.: US 6,465,843 B1
(45) Date of Patent: Oct. 15, 2002

(54) MOS-TRANSISTOR STRUCTURE WITH A TRENCH-GATE-ELECTRODE AND A LIMITED SPECIFIC TURN-ON RESISTANCE AND METHOD FOR PRODUCING AN MOS-TRANSISTOR STRUCTURE

(75) Inventors: Franz Hirler, Isen; Wolfgang Werner, München, both of (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/701,291

(22) PCT Filed: Mar. 1, 2000

(86) PCT No.: PCT/DE00/00621

§ 371 (c)(1),
(2), (4) Date: Apr. 27, 2001

(87) PCT Pub. No.: WO00/57481

PCT Pub. Date: Sep. 28, 2000

(30) Foreign Application Priority Data

Mar. 24, 1999 (DE) .......................... 199 13 375

(51) Int. Cl.[7] .................... H01L 29/76; H01L 29/94; H01L 31/113
(52) U.S. Cl. .................... 257/331; 257/330; 257/332
(58) Field of Search .................... 438/268, 184, 438/270, 299, 302, 639; 257/331, 330, 332, 493, 369, 565, 396, 74

(56) References Cited

U.S. PATENT DOCUMENTS

| 4,906,588 | A | * | 3/1990 | Harrington, III | ............. 437/44 |
|---|---|---|---|---|---|
| 4,943,537 | A | * | 7/1990 | Harrington, III | ............. 437/34 |
| 5,122,474 | A | * | 6/1992 | Harrington, III | ............. 437/44 |
| 5,216,275 | A | * | 6/1993 | Chen | .......................... 257/493 |
| 5,682,051 | A | * | 10/1997 | Harrington, III | ............ 257/369 |
| 5,688,722 | A | * | 11/1997 | Harrington, III | ............ 438/217 |
| 5,866,931 | A | * | 2/1999 | Bulucea et al. | ............. 257/331 |
| 6,001,678 | A | * | 12/1999 | Takahashi | ................... 438/238 |
| 6,020,600 | A | * | 2/2000 | Miyajima et al. | ............. 257/76 |
| 6,103,578 | A | * | 8/2000 | Uenishi et al. | ............. 438/268 |
| 6,118,159 | A | * | 9/2000 | Willer et al. | ................. 257/390 |
| 6,262,470 | B1 | * | 7/2001 | Lee et al. | .................... 257/565 |
| 6,297,101 | B1 | * | 10/2001 | Schaeffer | .................... 438/268 |

* cited by examiner

Primary Examiner—John F. Niebling
Assistant Examiner—Walter L. Lindsay, Jr.
(74) Attorney, Agent, or Firm—Laurence A. Greenberg; Werner H. Stemer; Gregory L. Maybeck

(57) ABSTRACT

MOS transistor structure having a trench gate electrode and a reduced on resistance, and methods for fabricating a MOS transistor structure A MOS transistor structure having a trench gate electrode and a reduced on resistance is described, the integral of the doping concentration of the body region in the lateral direction between two adjacent drift regions being greater than or equal to the integral of the doping concentration in a drift region in the same lateral direction.

Furthermore, methods for fabricating a MOS transistor structure are disclosed, body regions and drift regions being produced by epitaxial growth and implantation, repeated epitaxial growth or by filling trenches with doped conduction material.

19 Claims, 10 Drawing Sheets

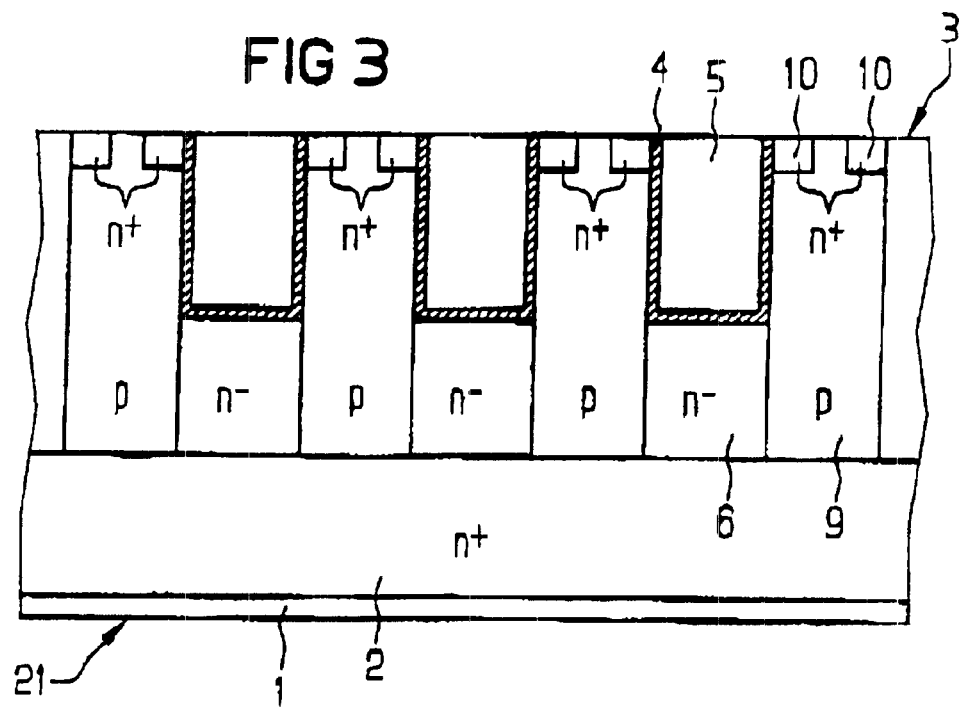
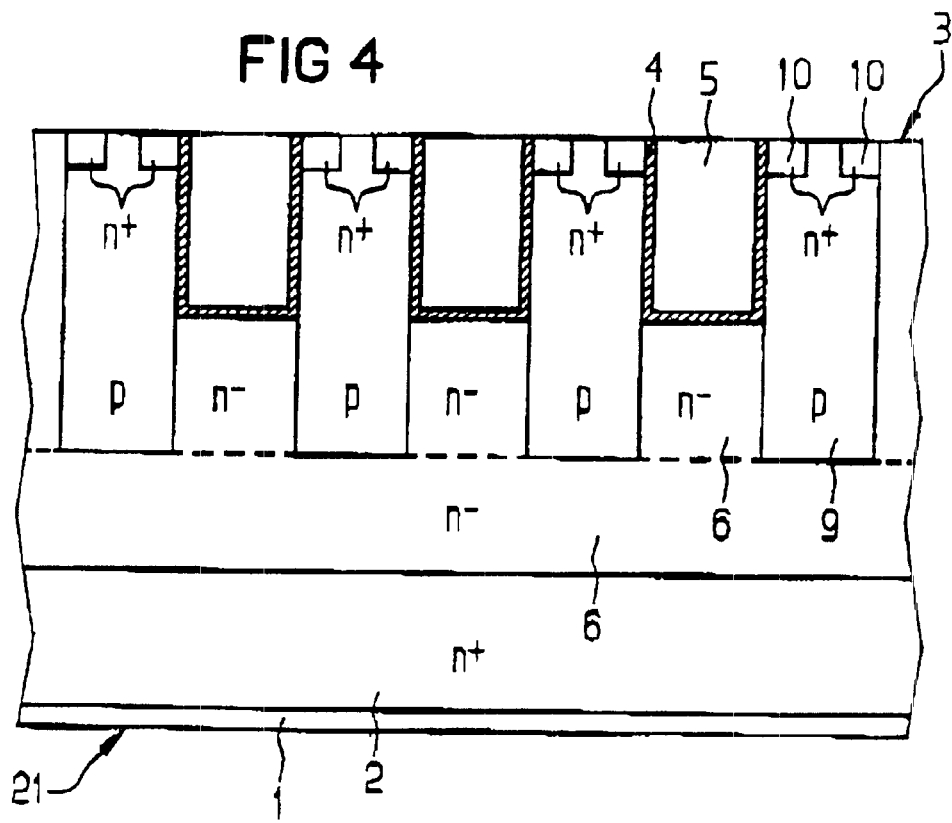

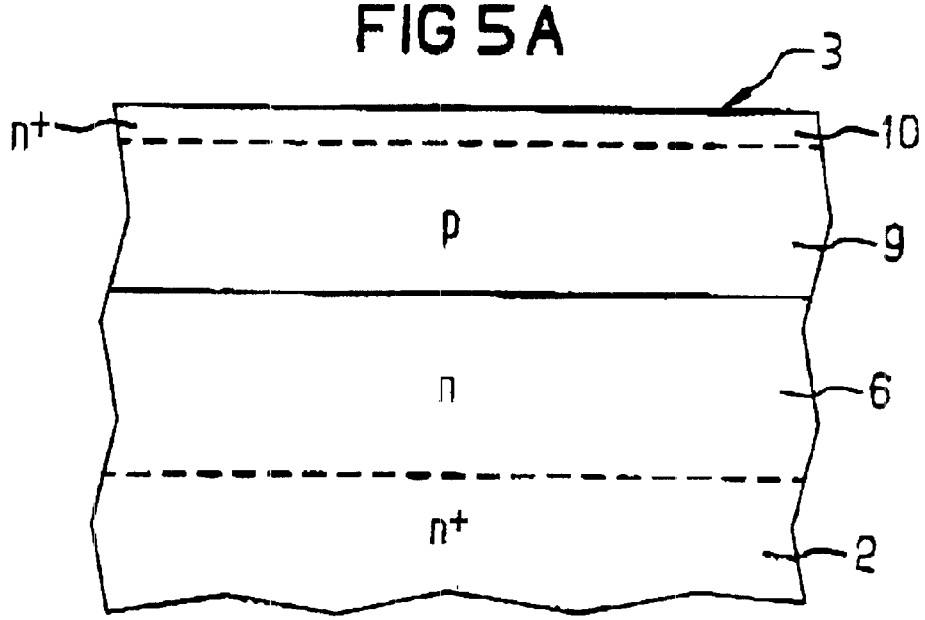
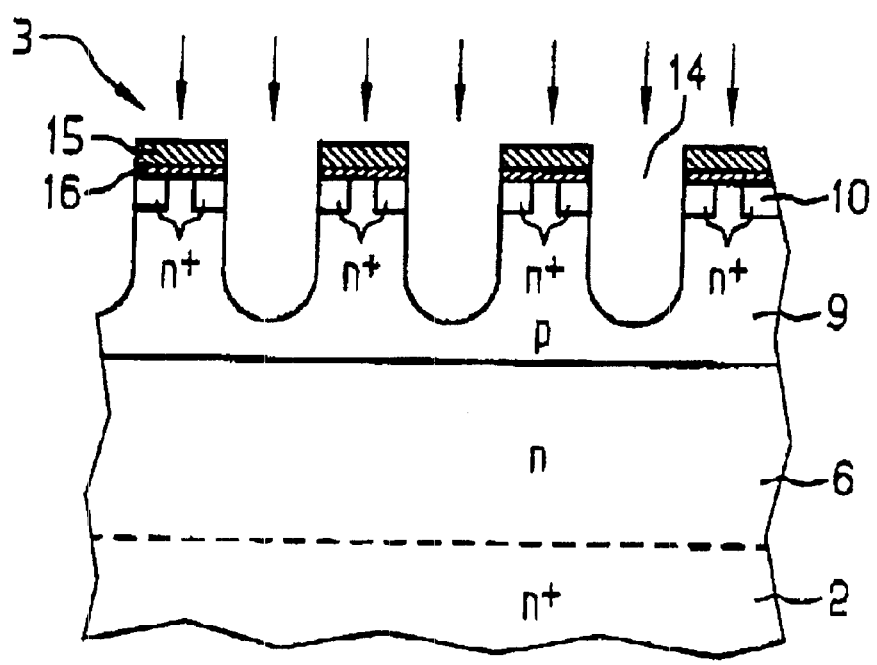

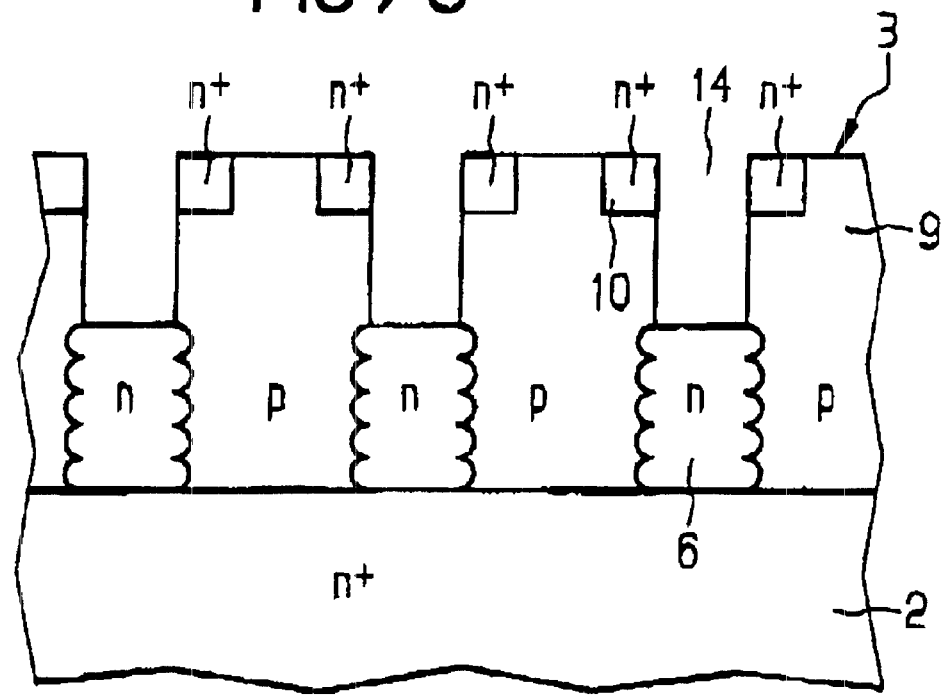
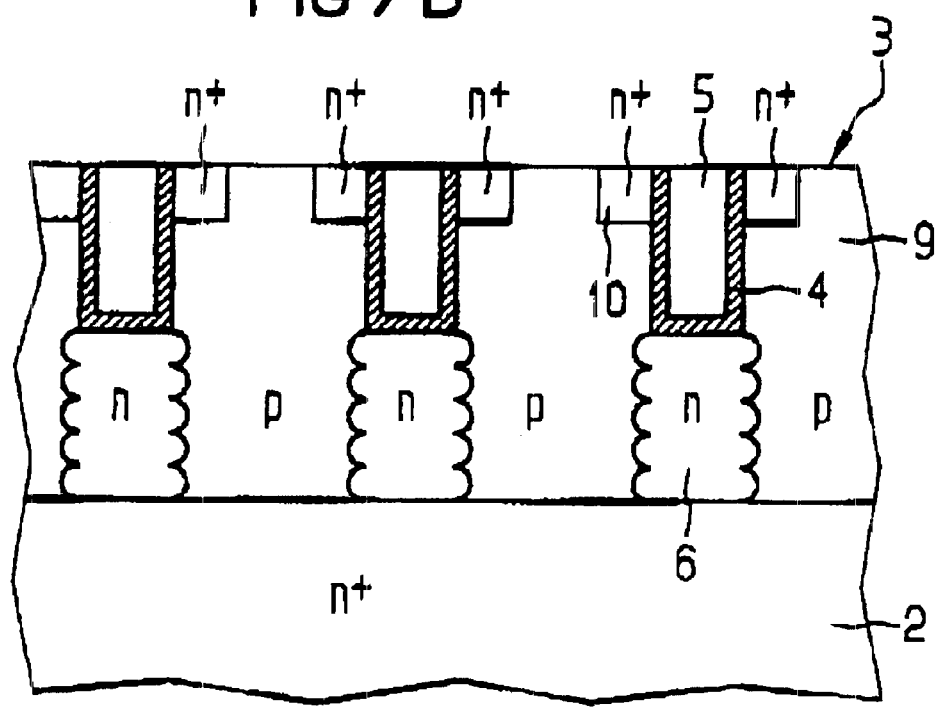

MOS-TRANSISTOR STRUCTURE WITH A TRENCH-GATE-ELECTRODE AND A LIMITED SPECIFIC TURN-ON RESISTANCE AND METHOD FOR PRODUCING AN MOS-TRANSISTOR STRUCTURE

BACKGROUND OF THE INVENTION

Field of the Invention

The present invention relates to a MOS transistor structure having a trench gate electrode and a reduced on resistance. An important aim in the development of MOS transistor structures, in particular for power transistors, is to reduce the on resistance of the transistor structure. This means that, on the one hand, the static power loss can be minimized and, on the other hand, higher current densities can be achieved, as a result of which smaller and cheaper semiconductor components can be used for the same overall current.

One known method for reducing the on resistance consists in using not a planar transistor structure but a transistor structure which has a trench gate electrode. The disadvantage of such transistor structures, however, is the occurrence of electric field spikes in the vicinity of the gate oxide of the trench electrodes, which, in the event of excessively high source-drain voltages due to avalanche in the adjoining silicon and injection of hot charge carriers, damage the gate oxide and lead to destruction of the component. A remedy to this problem disclosed in the prior art is to extend the body region below the trench gate electrode into the transistor structure. Such an arrangement is illustrated in FIG. 1 and can be gathered for example from WO 98/04004 or from U.S. Pat. No. 5,525,821. In this case, it may also be provided that, as illustrated in FIG. 1, a deep diffusion 8 having a relatively high doping concentration is provided in the body region, so that an avalanche breakdown takes place in the region of this deep diffusion 8. The disadvantage of this transistor structure, however, is that precisely such a deep diffusion has a large lateral extent, which counteracts a reduction in the size of the transistor structures for the purpose of reducing the on resistance.

A further possibility for reducing the on resistance is described in U.S. Pat. No. 5,216,275, where a compensation principle is employed in order to produce a largely intrinsic layer in the turned-off case but a layer of high conductivity in the switched-on case. To that end, instead of a drift region, provision is made of a layer of laterally alternating n-type and p-type regions whose charges largely cancel one another out in the turned-off case.

However, this requires the production of not only a substrate layer, a body region, a source region and a gate electrode but also a separate, specially patterned layer as drift region, which increases the structural outlay of the transistor arrangement.

SUMMARY OF THE INVENTION

The object of the present invention, therefore, is to provide a MOS transistor structure having a trench gate electrode which makes it possible to reduce the on resistance in a simple and effective manner.

This object is achieved by means of the features of patent claim 1. The features of patent claims 6 and 10 each describe a method according to the invention for fabricating a MOS transistor structure, particularly a MOS transistor structure as claimed in claims 1 to 5. A further method according to the invention is described by claim 12.

The MOS transistor structures according to the invention each have a highly doped substrate layer of a first conduction type, which defines a first surface of the transistor structure. A drain metallization layer is either provided directly on this first surface or, in the case of an IGBT, an anode zone may additionally be provided in this region, the corresponding metallization layer then being applied on said anode zone.

A body region of a second conduction type extends from a second surface of the transistor structure into the transistor structure. A source region of the first conduction type, which likewise extends from the second surface into the body region, is embedded in this body region.

Furthermore, a gate electrode extends from the second surface of the transistor structure into the transistor structure, and is arranged in a trench lined with a gate oxide. In this case, the trench has a depth which is smaller than the depth of the body region.

Finally, a drift region of the first conduction type is provided, which adjoins the bottom of the trench and extends as far as the substrate layer. In this case, this drift region may have, in particular in the region of the highly doped substrate layer, a lateral extent greater than the lateral extent of the trench of the gate electrode.

The solution according to the invention provides for the integral of the doping concentration of the body region in the lateral direction between two adjacent drift regions to be greater than or equal to the integral of the doping concentration in a drift region in the same lateral direction. The solutions according to the invention prevent an avalanche breakdown in the region of the trench gate electrode, at the same time a structure being provided whose structure size can be varied largely as desired. There are practically no obstacles to reducing the size of the transistor structures, as a result of which it is possible to increase the channel width per area and thus to reduce the on resistance. Moreover, relatively high doping of the body region and of the drift region is possible since the two regions are largely reciprocally depleted in the turned-off case and, consequently, a largely intrinsic region is produced which can effectively take up reverse voltages.

In the turned-on case, however, the increased doping concentration comes to fruition and results in a higher conductivity. This holds true particularly if the integral of the doping concentration of the body region in the lateral direction is equal to the integral of the doping concentration in the adjoining drift region in the same lateral direction. Practically complete reciprocal depletion of the two regions in the turned-off case is achieved here. By contrast, if the integral of the doping concentration of the body region is chosen to be greater than the integral of the doping concentration in the drift region, then a remainder of charge carriers remains in the body region in the turned-off case, whereby it can be ensured that a possible avalanche breakdown takes place in the region of the body region and not in the region of the trench gate electrode.

The present transistor structure is thus constructed significantly more simply than the structure from the prior art, specifically than the structure from U.S. Pat. No. 5,216,275, in which additional patterning of the drift region is also necessary. This is avoided in the case of the present invention by virtue of advantageous adaptation of the body region itself.

A preferred embodiment provides for the integral of the doping concentration in the body region in the lateral direction to be a maximum of $2 \times 10^{12}$ cm$^{-2}$. This value generally lies in the region just below the breakdown charge, i.e. that charge in the corresponding body region in the case of which a breakdown would take place at the pn junction to the adjoining drift region before the region can be completely depleted. In order to avoid such a breakdown, the doping concentration is chosen to be correspondingly lower.

It may be provided that the body region is formed by an epitaxial layer. The drift region can then be implemented for example by means of implantation steps, diffusion steps or filling previously formed trenches with semiconductor material. In this respect, reference is made to the description below of various fabrication possibilities. Fabricating doped regions by filling trenches is disclosed in principle in U.S. Pat. No. 5,216,275.

In order, for example, to be able to make the threshold voltage in the channel region independent of the total charge of the body region, it may be provided that the doping concentration of the body region has a gradient. In this case, it is possible to provide a gradient in the lateral direction and/or a gradient in the vertical direction in the body region.

In a first method according to the invention for fabricating a MOS transistor structure, the following steps are carried out:

providing a highly doped substrate layer of a first conduction type, epitaxially growing a body layer of a second conduction type, forming a source region in the body layer, patterning a trench into the body layer, which trench adjoins the source region, implanting doping material of the first conduction type through the bottom of the trench into the body layer before or after the formation of a gate oxide layer which lines the trench, the trench with a gate electrode.

Consequently, a body layer is epitaxially grown directly on the highly doped substrate layer, without a drift region also having to be provided between these two layers. In this case, in a preferred embodiment, the doping concentration of the body layer is varied during the growth. A drift region is formed only after the patterning of gate trenches into the body layer. In this case, the doping material is implanted into the body layer in such a way as to produce a drift region which reaches from the bottom of the gate trench as far as the highly doped substrate layer. This can be done by an appropriate choice of the geometry and of the implantation parameters, or by an out diffusion of the doping material as far as the highly doped substrate layer, said out diffusion being carried out after the implantation. As an alternative, it is also possible to carry out a plurality of implantation steps having different implantation energy in order to fabricate a drift region of the desired extent as far as the highly doped substrate layer.

The gate trench can be patterned into the body layer in such a way that it directly adjoins a source region. However, it may also be provided that the trench is patterned into the body layer through a source region, with the result that the trench automatically adjoins the source region and the body layer.

In a further method according to the invention, a MOS transistor structure is fabricated using a construction technique. The following steps are performed in this case:

providing a highly doped substrate layer of a first conduction type, forming body regions and drift regions by repeated epitaxial growth of a doped partial layer of the first or second conduction type, in which case, after each process of growing the partial layer, regions of the opposite conduction type are produced in the partial layer for the purpose of forming pillar-type structures, forming source regions in the body regions, patterning trenches in the drift regions, which adjoin at least one body region and a source region, lining the trenches with a gate oxide layer, and filling the trenches with a gate electrode.

In this case, it may be provided that the pillar-type structures described are formed as early as when the first partial layer is grown. However, it may also be provided that first of all one or more partial layers for forming a further drift region are grown on the highly doped substrate layer. only when subsequent partial layers are grown are the pillar-type structures then formed by the provision of the corresponding regions of the opposite conduction type in the partial layers. In this case, then, when the structure is complete, the body region is a certain distance from the highly doped substrate layer, the two regions being separated from one another by a drift region.

Although this method is somewhat more complicated than the first method due to the need for repeated growth of partial layers and the introduction of doped regions into the partial layers, on the other hand it is possible to set a more exact doping of the different regions, i.e. of the body region and of the drift region, and also their position and extent in the transistor structure.

By contrast, the first method according to the invention has the advantage that, as a result of the epitaxial growth, the body layer can be produced with a relatively precisely defined doping concentration in accordance with the desired specifications, it then being possible for the drift region to be produced by a single or by a plurality of directly successive implantation steps, if appropriate with subsequent outdiffusion.

A third method according to the invention for fabricating a MOS transistor structure has the following steps:

providing a highly doped substrate layer of a first conduction type, providing a body layer of a second conduction type on the highly doped substrate layer, forming trenches in the body layer, filling the trenches with doped semiconductor material of the first conduction type, etching back the doped semiconductor material on the surface of the transistor structure as far as the body layer, so that drift regions of the first conduction type and body regions of the second conduction type adjoin the surface, forming source regions in the body regions, patterning trenches into the drift regions, the trenches adjoining at least one body region and a source region, lining the trenches with a gate oxide layer, filling the trenches with a gate electrode.

consequently, the body region can be produced for example by growing an epitaxial layer with a doping of a corresponding conduction type on the highly doped substrate layer, or, if appropriate, on a drift region which has been provided on the highly doped substrate layer. The drift region is then formed by patterning trenches and filling them with semiconductor material. Afterwards, the gate trenches can, for example, be formed using the same mask which was used to produce the trenches for the drift region, insofar as this is allowed by the tolerances for renewed application of this common mask. Consequently, in the ideal case, it is possible to save an additional mask for patterning the gate trenches.

In each of the above-described methods according to the invention, it may be provided that the doping concentration of the body regions and of the drift regions is set in such a way that the integral of the doping concentration in a drift region in the lateral direction between two adjacent body regions is less than or equal to the integral of the doping concentration of the body region in the same lateral direction. As a result of this, it is possible to achieve, as already described, a reciprocal depletion of the regions and hence an increased voltage take up and conductivity of the regions, it being possible at the same time to restrict a possible avalanche breakdown to the region of the body region. In this case, the integral of the doping concentration in a body region in the lateral direction is preferably restricted to a maximum of $2 \times 10^{12}$ cm$^{-2}$.

BRIEF DESCRIPTION OF THE DRAWINGS

FIG. 3 shows a schematic illustration of a transistor arrangement with body regions reaching as far as the highly doped substrate layer.

FIG. 4 shows an arrangement according to FIG. 3, a drift region being provided between the body regions and the substrate layer.

DESCRIPTION OF THE PREFERRED EMBODIMENT

Figure 1:
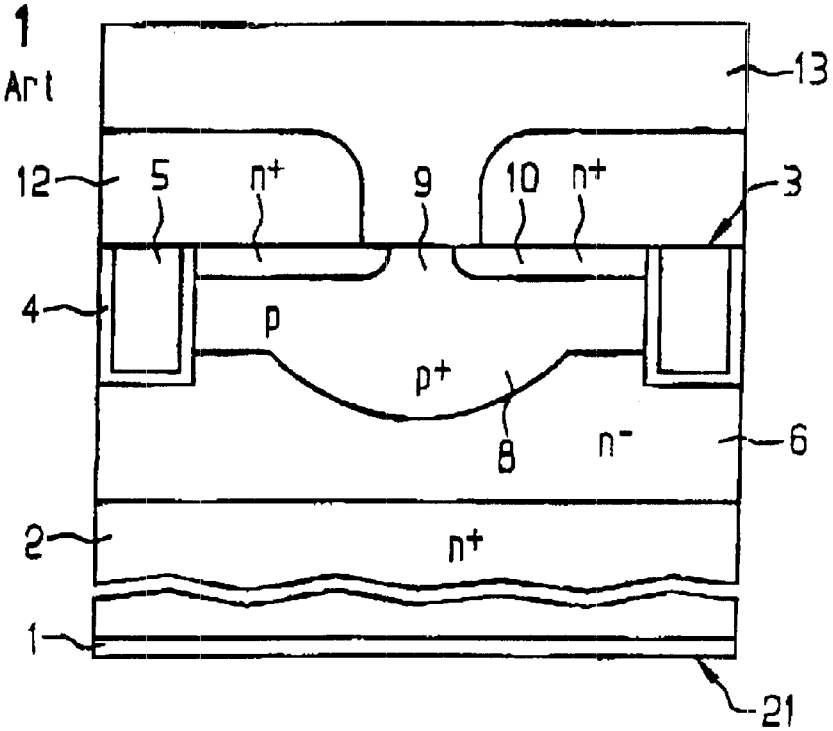
FIG. 1 shows a transistor arrangement with deep diffusion in the body region according to the prior art.

As already explained, FIG. 1 shows a MOS transistor arrangement according to the prior art. In this case, a highly doped n$^+$-type substrate layer 2 defines a first surface 21 of the transistor arrangement. A drain metallization layer 1 is applied to this first surface 21. An n$^-$-type drift region 6 is arranged over the highly doped substrate layer 2. This drift region 6 is adjoined by a p-type body region 9, which has a highly doped p$^+$-type deep diffusion 8. n$^+$-type source regions 10 are diffused into the body region 9. The body region 9 and the source regions 10 extend from a second surface 3 of the MOS transistor arrangement into the transistor structure. Gate electrodes 5, which are surrounded by a gate oxide 4 and are arranged in a gate trench, likewise extend from the second surface 3 into the transistor structure. An oxide layer 12 covers the gate electrodes 5 and parts of the source regions 10. A metallization layer 13 serves for making contact with the source regions 10 and also the body region 9.

Figure 2:
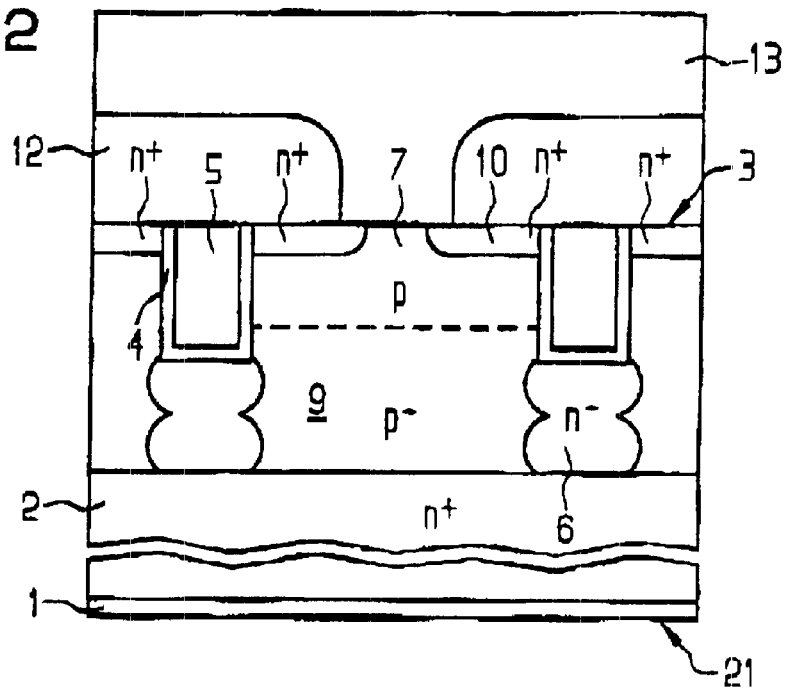
FIG. 2 shows a transistor arrangement with an epitaxial layer as body layer and implanted drift regions under the gate trenches.

FIG. 2 shows an exemplary embodiment of a transistor structure according to the invention, the body region 9 being formed by an epitaxial layer. The latter can, as illustrated in FIG. 2, have a gradient with regard to its doping concentration. Thus, a lower region of the body layer is formed, having a p$^-$-type doping, and an upper region 7 of the body layer is formed, having a higher, p-type doping which serves for setting the threshold voltage in the channel region of the transistor structure. The body layer 9 directly adjoins the highly doped n$^+$-type substrate layer 2. The n$^-$-type drift region 6 is formed only by implanted regions below the gate electrode 5. In this case, the doping concentration of the body layer 9 and also of the drift region 6 are set in such a way that the lateral integral of the doping concentration of the body layer 9 between two drift regions 6 is greater than or equal to the integral of the doping concentration in a drift region 6 in the same lateral direction. In this case, the integral of the doping concentration is a maximum of $2 \times 10^{12}$ cm$^{-2}$.

FIGS. 3 and 4 schematically illustrate two possibilities for arranging the drift regions 6 and also the body regions 9. As shown in FIG. 3, the body regions can reach as far as the highly doped n$^+$-type substrate layer 2 and thus adjoin the latter directly. However, it may also be the case, as illustrated in FIG. 4, that the body regions 9 do not reach right down to the highly doped substrate layer 2, but rather that the n$^-$-type drift region 6 on the one hand extends under the gate electrodes 5 and on the other hand is also arranged between the body regions 9 and the highly doped substrate layer 2. The broken lines in the drift region 6 are intended to indicate that the regions under the gate electrodes 5 and also between the body regions 9 and the highly doped substrate layer 2 generally have a largely uniform doping. However, it may also be provided that, in order to better ensure a reciprocal depletion of the drift region 6 and of the body regions 9, a somewhat different doping concentration is chosen in the drift region under the gate electrodes than in that region which adjoins the highly doped substrate layer.

FIG. 5 shows the fabrication of a transistor structure in partial steps a to d, the drift region 6 being formed under the gate electrodes 5 by implantation of doping material through the bottom of the gate trenches 14. For this purpose, firstly a p-type body layer 9 is provided on a highly doped n$^+$-type substrate layer 2, as shown in FIG. 5a. In this case, as shown in FIG. 5a, it may also be provided that a first drift region 6 is already arranged between the body layer 9 and the substrate layer 2. It is also possible to form n$^+$-type source regions 10 in the region of the second surface 3 of the transistor structure as early as in this step.

Figure 5C:
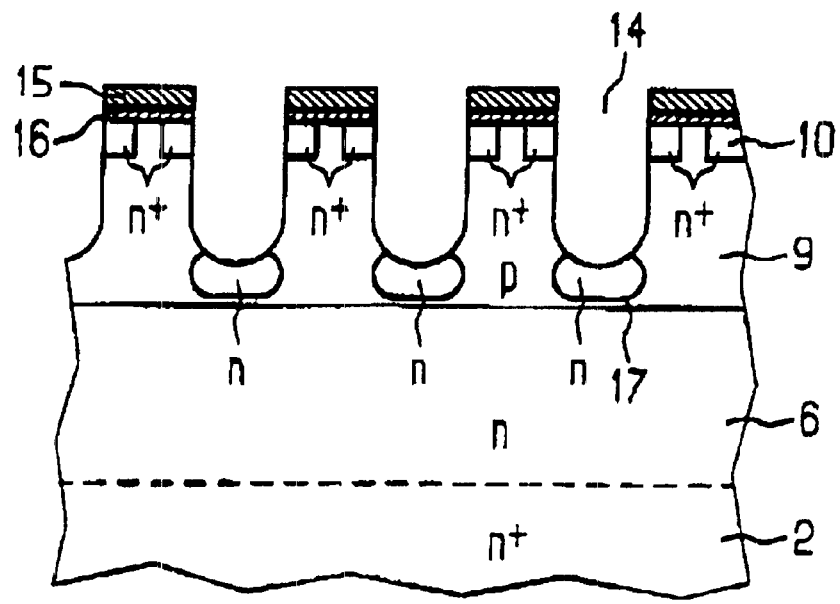
FIG. 5 shows an illustration of the steps for fabricating a transistor structure with implantation of doping material through the bottom of the gate trenches.

Gate trenches 14 are subsequently patterned into the p-type body layer 9. In this case, those regions of the body layer which are not to be patterned are covered by a mask, for example made of an oxide layer 16 and a nitride layer 15. This is followed by the implantation of n-type doping material through the bottoms of the gate trenches 14 into the p-type body layer 9. Consequently, n-doped regions 17 are formed in the p-type body layer 9, as shown in FIG. 5c. Depending on the type of implantation, these n-type regions 17 may already reach as far as the drift region 6. However, it may also be provided that the n-type regions 17 are extended by a subsequent diffusion step. The n-type regions 17 enlarged in such a way then merge, as shown in FIG. 5d, with the drift region 6 arranged under the p-type body layer 9.

Afterwards, in order to complete the transistor structure, the gate trenches can be filled with a gate oxide 4 and a gate electrode 5. Finally, the oxide layer 12 is arranged over the gate electrode and the metallization layer 13 is arranged over the source regions 10 and the body layer 9.

Figure 5D:
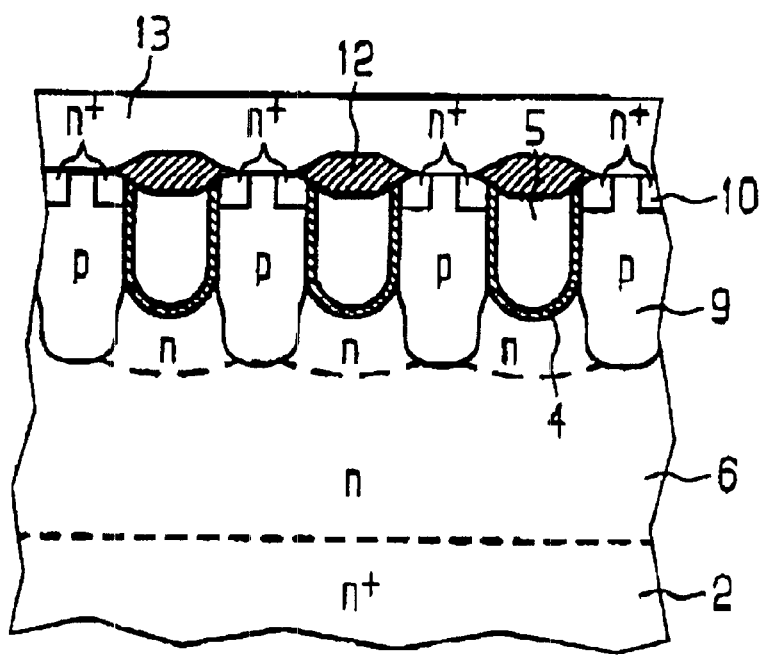

As is clearly shown in Figure 5d, the effect that can be achieved by implantation and, if appropriate, subsequent outdiffusion is that the initially continuous body layer 9 is subdivided into individual body regions 9 which are separated from one another. This does not require the presence of a drift region 6 between the body layer 9 and the highly doped substrate layer 2, as shown in the illustration in FIG. 2. In this case, the body layer is separated into individual body regions 9 solely by the implantation of a drift region 6 under the gate electrode 5.

In steps a to e, FIG. 6 shows the fabrication of a transistor arrangement by filling trenches with semiconductor material. For this purpose, analogously to FIG. 5a, firstly there are provided a highly doped substrate layer 2, a drift region 6, and, arranged above the latter, a p-type body layer 9, and already, if appropriate, source regions 10. However, it is also possible to dispense with the provision of an n-type drift region 6 in accordance with FIG. 6a.

Figure 6A:
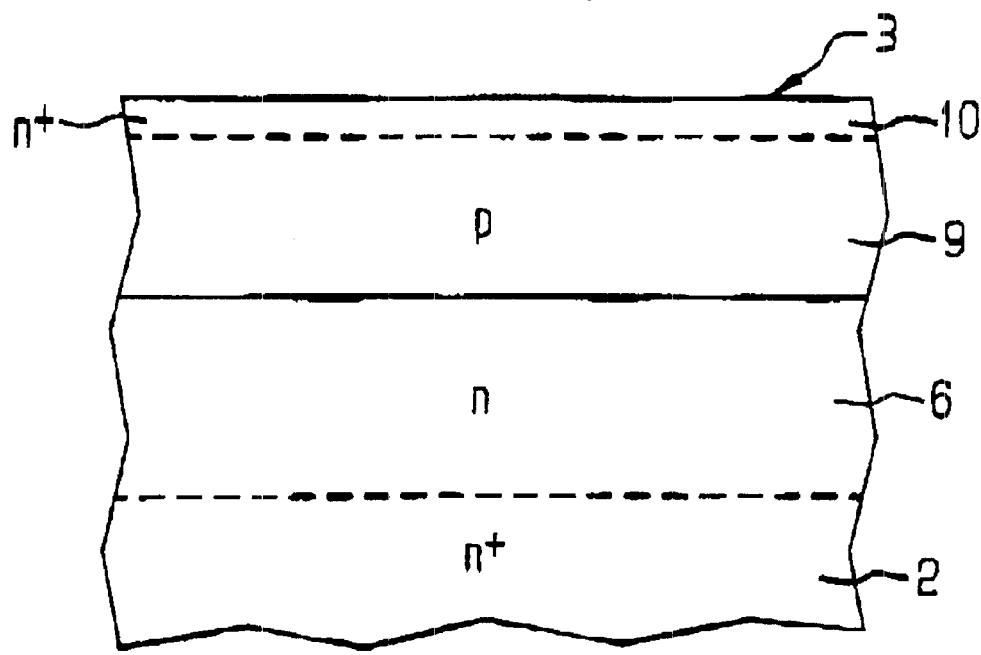
FIG. 6 shows the fabrication of a MOS transistor arrangement by filling trenches in a body layer with semiconductor material of the opposite conduction type.
Figure 6B:
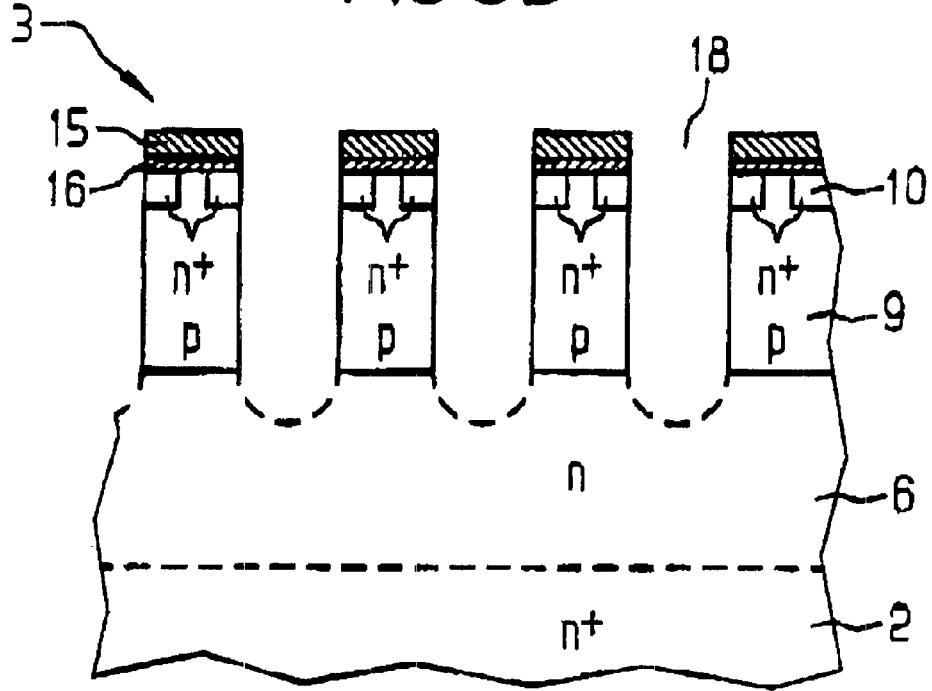
Figure 6C:
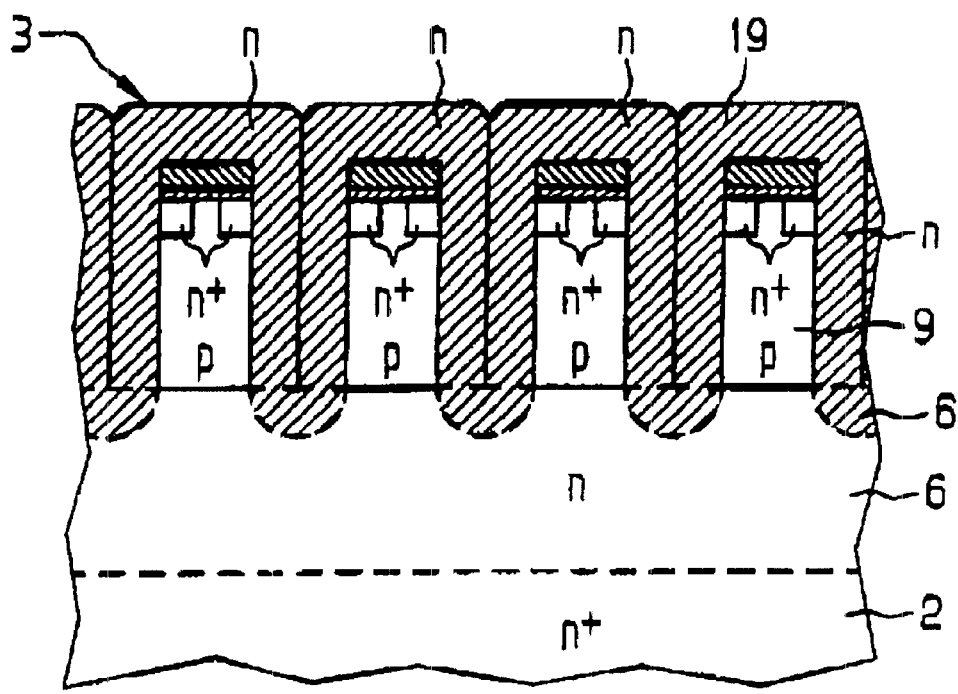
Figure 6D:
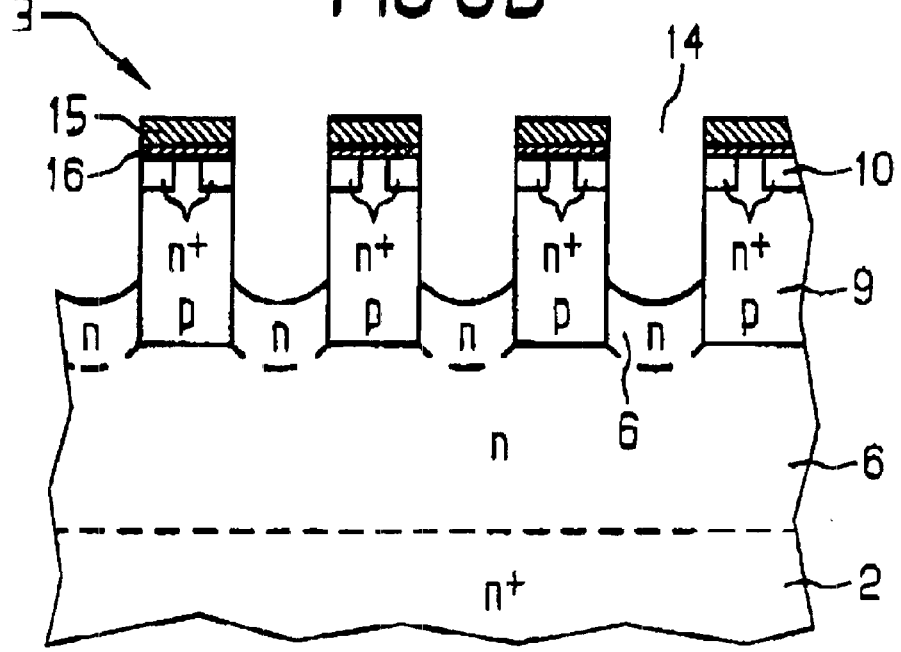

In accordance with FIG. 6b, firstly trenches 18 are patterned into the p-type body layer 9, with the result that the body layer 9 is subdivided into individual body regions 9. A mask made of silicon oxide 16 and silicon nitride 15 can be used for this purpose.

The trenches 18 are subsequently filled with n-doped semiconductor material 19, which completely lines the trenches 18 and also covers the surface 3 of the transistor structure. The semiconductor material 19 is etched back in the region of the surface 3 to an extent such that the body regions 9 appear at the surface 3 again.

The gate trenches 14 are subsequently patterned into the drift regions 6 between the body regions 9, the gate trenches 14 having a smaller depth than the trenches 19 which were patterned beforehand in order to form the drift regions 6 between the body regions 9. Ideally, the same mask that has already been used beforehand to form the trenches 19 can be used to form the gate trenches.

Figure 6E:
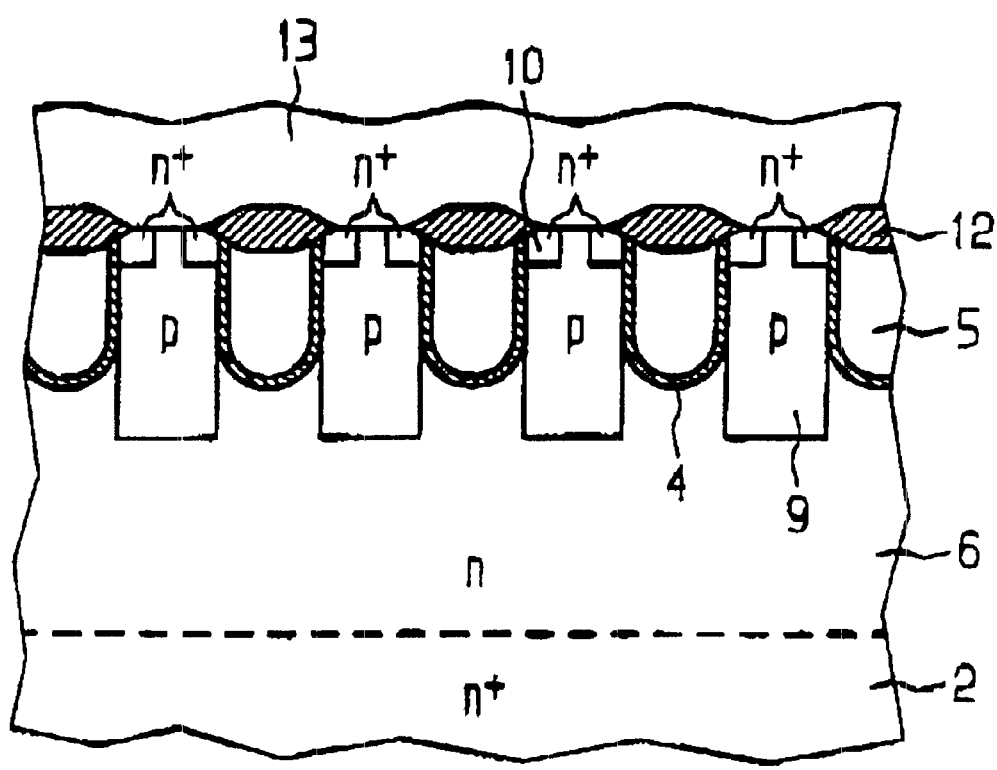

FIG. 6e shows the finished transistor structure after the filling of the gate trenches 14 with a gate oxide 4 and a gate electrode 5, and after the provision of the oxide layer 12 and of the metallization layer 13.

In steps a to d, FIG. 7 shows the fabrication of a transistor arrangement using a construction technique, successive epitaxial partial layers 20 being grown on a highly doped substrate layer 2. FIGS. 7e and 7f show an alternative to FIGS. 7a and 7c.

Figure 7A:
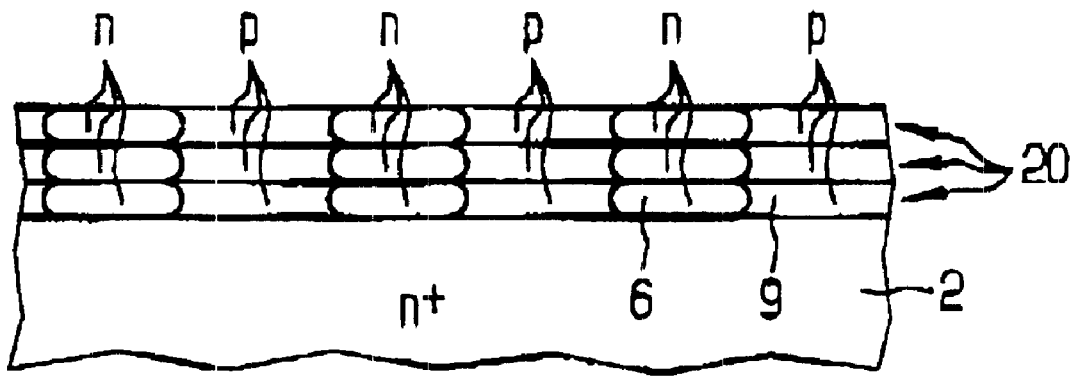
FIG. 7 shows the fabrication of a transistor arrangement using a construction technique by successively growing partial layers and introducing doping material of the opposite conduction type into the partial layers.
Figure 7B:
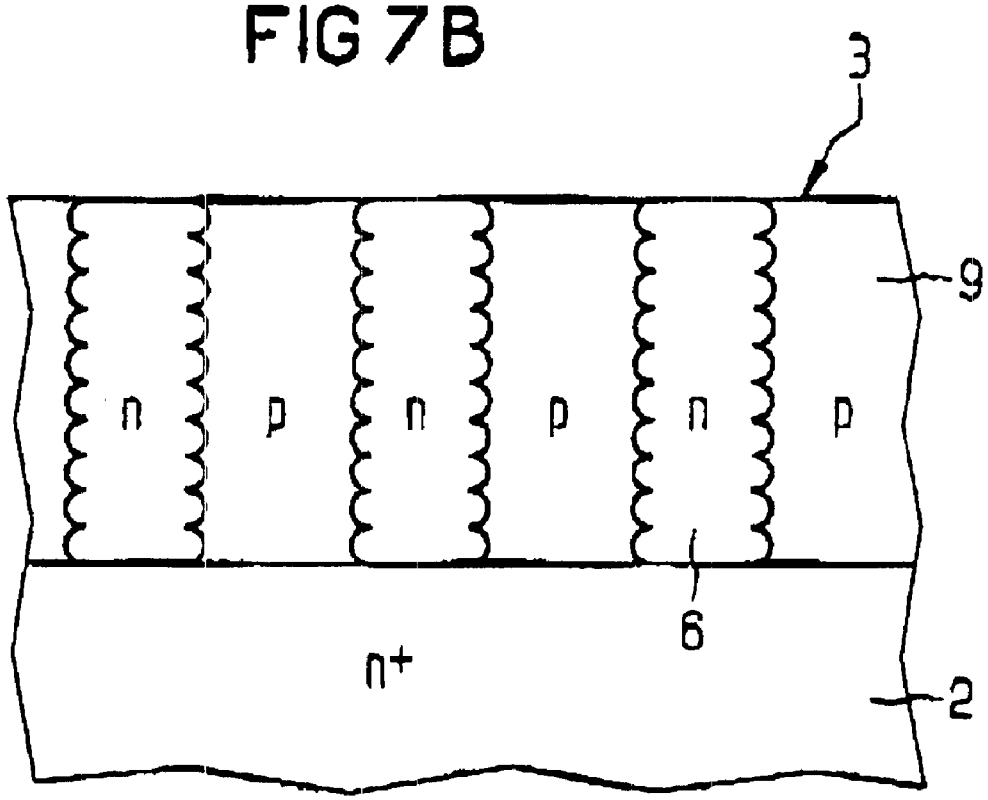

In accordance with FIG. 7a, a plurality of p-type epitaxial partial layers 20 are grown one after the other on a highly doped n+-type substrate layer 2. After the growth of each partial layer 20, n-doped regions 6 are formed in the partial layers 20. This can be done by implantation or diffusion, for example. In this case, the n-doped regions are arranged in such a way that they form drift regions 6 which are continuous as pillar-like structures across a plurality of partial layers 20. In this case, p-type body regions 9 are formed automatically between these drift regions 6 and likewise have a pillar-like structure. Such an arrangement after the growth of all the partial layers 20 is illustrated in FIG. 7b. In this case, the last of the partial layers forms the second surface 3 of the transistor structure.

As shown in FIG. 7c, n+-type source regions 10 are subsequently formed in the p-type body regions 9, and gate trenches 14 are patterned into the drift regions 6, with the result that the gate trenches 14 each adjoin at least one source region 10 and a p-type body region 9. In this case, the gate trenches 14 extend from the second surface 3 of the transistor structure into the transistor structure, but to a smaller depth than the p-type body regions 9. Finally, a gate oxide 4 and a gate electrode 5 are formed in each of the gate trenches 14. Afterwards, the oxide layer 12 and a metallization layer 13 can be provided on the transistor structure in a customary manner.

Figure 7E:
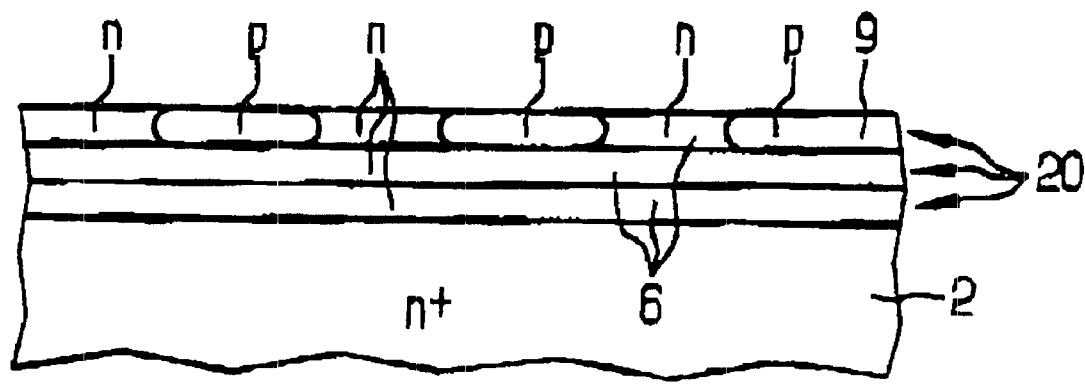
Figure 7F:
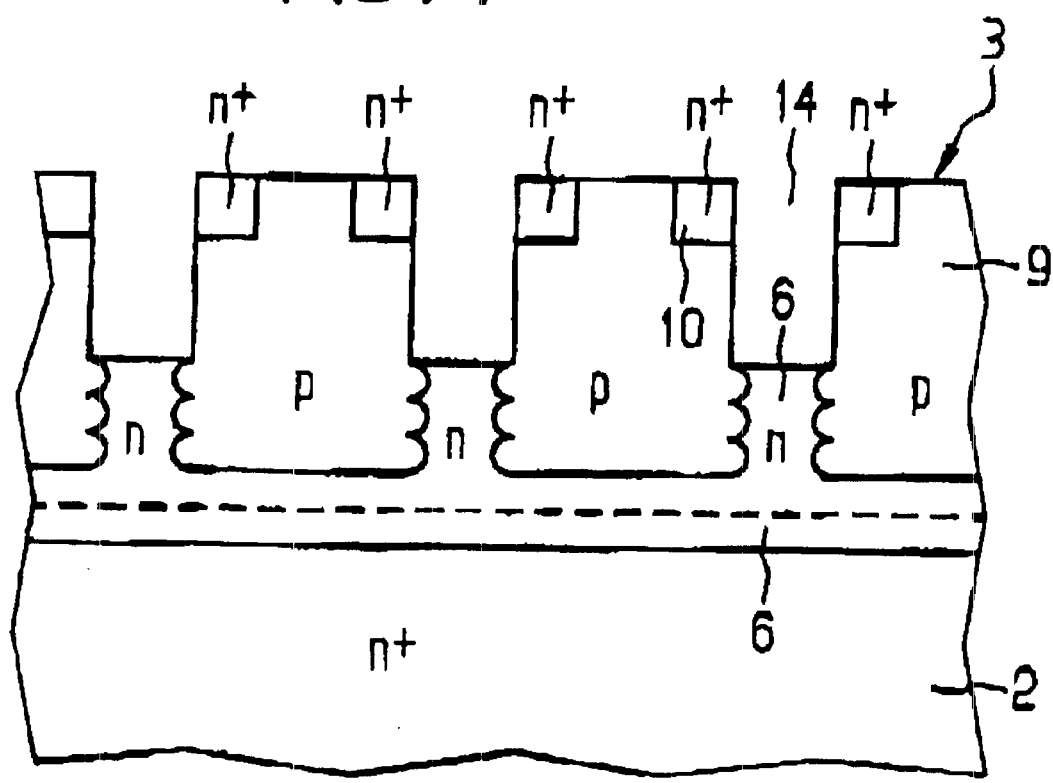

As an alternative to the method illustrated in FIG. 7a, it may also be provided that n-doped epitaxial layers are grown as partial layers 20. In this case, it may be provided that firstly a number of partial layers are produced on the highly doped substrate layer 2, into which, however, no p-doped regions are diffused. A drift region is thus formed over the n+-doped substrate layer 2. Only after a certain number of n-doped partial layers have been formed are p-doped regions 9 formed in the further partial layers 20, as shown in FIG. 7e. In this case, the p-doped regions 9 are arranged in such a way as to produce pillar-like structures constituting p-type body regions 9. These body regions 9 are separated from one another by n-type drift regions 6, which likewise have a pillar-like structure, as becomes clear from FIG. 7f. After all the partial layers 20 have been deposited and the pillar-like structure has thus been completed, the source regions 10 are formed and gate trenches 14 are patterned into the pillar-like drift regions 6. The further method steps which have already been explained in connection with FIG. 7d are then carried out.

In each of the fabrication methods described, it may either be provided that uniformly doped body regions 9 are produced; however, a lateral and/or vertical gradient of the doping concentration may also be provided in the body regions 9.

We claim:

1. A MOS transistor structure, comprising:
    a highly doped substrate layer of a first conduction type which defines a first surface;
    a second surface;
    a body region of a second conduction type that is opposite to the first conduction type, said body region extending from said second surface to the substrate layer to define a depth;
    a source region of the first conduction type, said source region extending from said second surface into said body region;
    a trench formed in said body region and having a bottom, said trench extending from said second surface and being lined with a gate oxide;
    a gate electrode located in said trench and having a depth that is smaller than said depth of said body region; and
    drift regions of the first conduction type, said drift regions adjoining said bottom of said trench and extending as far as said substrate layer;
    an integral of a doping concentration of said body region in a lateral direction between two adjacent ones of said drift regions is not less than an integral of a doping concentration in one of said drift regions in the lateral direction.

2. The transistor structure according to claim 1, wherein the integral of the doping concentration of said body region in the lateral direction is less than a breakdown charge.

3. The transistor structure according to claim 2, wherein the integral of the doping concentration of the body region in the lateral direction is a maximum of $2 \times 10^{12}$ cm$^{-2}$.

4. The transistor structure according to claim 1, comprising an epitaxial layer forming said body region.

5. The transistor structure according to claim 1, wherein the doping concentration of said body region has a gradient.

6. A method for fabricating a MOS transistor structure, which comprises:

providing a highly doped substrate layer of a first conduction type;

epitaxially growing a body layer of a second conduction type on the highly doped substrate layer;

forming a source region in the body layer;

patterning a trench in the body layer such that the trench adjoins the source region and has a bottom;

implanting doping material of the first conduction type through the bottom of the trench into the body layer to produce a drift region extending from the bottom of the trench as far as the highly doped substrate layer;

before or after performing the step of implanting the doping material, forming a gate oxide layer that lines the trench; and filling the trench with a gate electrode.

7. The method according to claim 6, which comprises, during the step of epitaxially growing the body layer, varying the doping concentration of the body layer.

8. The method according to claim 6, wherein the step of implanting the doping material includes a plurality of implantation steps having respectively different implantation energies.

9. The method according to claim 6, wherein the step of patterning the trench is performed by patterning the trench through the source region.

10. A method for fabricating a MOS transistor structure, which comprises:

providing a highly doped substrate layer of a first conduction type;

growing a sequence of doped, epitaxial partial layers of a given conduction type on the highly doped substrate layer;

after each process of growing one of the partial layers, producing doped regions in the one of the partial layers such that the sequentially produced doped regions and the sequentially produced partial layers together define pillar-type structured body regions and pillar-type structured drift regions;

producing the doped regions to have a conduction type opposite that of the given conduction type of the partial layers;

forming source regions in the body regions;

patterning trenches in the drift regions and producing the trenches to adjoin at least one of the body regions and at least one of the source regions;

lining the trenches with a gate oxide layer; and filling the trenches with a gate electrode.

11. The method according to claim 10, which comprises:

before growing the sequence of the doped, epitaxial partial layers, providing a further drift region on the highly doped substrate layer.

12. A method for fabricating a MOS transistor structure, which comprises:

providing a highly doped substrate layer of a first conduction type;

providing a body layer of a second conduction type on the highly doped substrate layer;

forming trenches in the body layer;

filling the trenches with doped semiconductor material of the first conduction type;

etching back the doped semiconductor material as far as the body layer so that drift regions of the first conduction type and body regions of the second conduction type define a surface;

forming source regions in the body regions;

patterning trenches into the drift regions such that each one of the trenches adjoins at least one of the body regions and one of the source regions;

lining the trenches with a gate oxide layer; and filling the trenches with a gate electrode.

13. The method according to claim 12, which comprises, before, providing the body layer, providing a first drift region on the highly doped substrate layer.

14. The method according to claim 13, which comprises:

using a mask to perform the step of patterning the trenches into the drift regions; and using the mask to pattern the trenches for the electrode.

15. The method according to claim 12, which comprises:

using a mask to perform the step of patterning the trenches into the drift regions; and using the mask to pattern the trenches for the electrode.

16. The method according to claim 12, which comprises:

setting a doping concentration of the body regions and of the drift regions such that an integral of the doping concentration in one of the drift regions in the lateral direction between two adjacent ones of the body regions is not greater than an integral of the doping concentration of one of the body regions in the same lateral direction.

17. The method according to claim 12, which comprises:

setting a doping concentration of the body regions such that an integral of the doping concentration in one of the body regions in a lateral direction is less than a breakdown charge.

18. The method according to claim 17, which comprises:

setting the doping concentration of the body regions such that the integral of the doping concentration in the one of the body regions in the lateral direction is, a maximum of $2 \cdot 10^{12}$ cm$^{-2}$.

19. The method according to claim 12, which comprises forming the body regions with a doping concentration having a gradient.

* * * * *